US006316969B1

(12) United States Patent
Forbes et al.

(10) Patent No.: US 6,316,969 B1
(45) Date of Patent: Nov. 13, 2001

(54) DIFFERENTIAL RECEIVERS IN A CMOS PROCESS

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/258,739

(22) Filed: Feb. 26, 1999

(51) Int. Cl.[7] .................. H03H 7/38; H03K 19/0185; H03K 3/356
(52) U.S. Cl. ...................... 327/55; 327/57; 327/210; 326/30
(58) Field of Search .................. 327/52, 54, 55, 327/57, 65, 67, 199, 208, 210; 333/17.3; 365/207, 208; 326/30

(56) References Cited

U.S. PATENT DOCUMENTS

| 4,180,786 | * | 12/1979 | Forward et al. | 327/310 |
| 4,616,148 | * | 10/1986 | Ochii et al. | 327/55 |
| 4,843,264 | * | 6/1989 | Galbraith | 327/55 |
| 4,887,047 | * | 12/1989 | Somerville | 330/257 |
| 5,165,046 | * | 11/1992 | Hesson | 327/513 |
| 5,329,190 | * | 7/1994 | Igarashi et al. | 327/50 |
| 5,357,211 | * | 10/1994 | Bryson et al. | 327/108 |
| 5,486,782 | * | 1/1996 | Chan | 327/112 |

(List continued on next page.)

OTHER PUBLICATIONS

Blalock, T.N., et al., "A High–Speed Sensing Scheme for 1T Dynamic RAM's Utilizing the Clamped Bit–Line Sense Amplifier", *IEEE Journal of Solid–State Circuits*, 27(4), 618–625, (Apr. 1992).

(List continued on next page.)

*Primary Examiner*—Timothy P. Callahan
*Assistant Examiner*—Terry L. Englund
(74) *Attorney, Agent, or Firm*—Schwegman, Lundberg, Woessner & Kluth, P.A.

(57) ABSTRACT

Differential receiver having a pair of cross coupled amplifiers improves signal detection in CMOS circuits. Each amplifier includes a first transistor of a first conductivity type and a second transistor of a second conductivity type. A signal input node is coupled to a source region for the first transistor. A signal output node is coupled to drain regions for the first transistor and the second transistor. The differential receiver further includes a third transistor of a first conductivity type. The signal input node for each amplifier is coupled to a gate of the third transistor of the respective amplifier. A drain region of this third transistor is coupled to a positive voltage supply and a source region is coupled to a low voltage potential. The drain region of the third transistor is also coupled to the gate of the first transistor of the respective amplifier.

Methods of operation and methods of forming the differential receiver include designing the receiver for current signaling to better impedance match high speed low impedance transmission lines. The novel receiver employs feedback driven by a transmission line coupled to the receiver's input to decrease the input impedance of the receiver. The receiver can match the low impedance of transmission lines while keeping the sizes of devices small and the power dissipation low. In this manner, the receiver facilitates the transmission of high speed signals over long distances with minimal ringing, reflections, noise and cross talk in integrated circuit interconnections.

67 Claims, 8 Drawing Sheets

U.S. PATENT DOCUMENTS

| | | | | |
|---|---|---|---|---|
| 5,552,728 | * | 9/1996 | Lin | 327/57 |
| 5,754,480 | * | 5/1998 | Sato | 365/189.05 |
| 5,821,777 | * | 10/1998 | Tanoi | 326/56 |
| 5,900,779 | * | 5/1999 | Giacomini | 330/252 |
| 5,963,061 | * | 10/1999 | Briner | 327/55 |
| 6,114,895 | * | 9/2000 | Stephens | 327/112 |

OTHER PUBLICATIONS

Blennemann, H., et al., "Off–Chip 400 MBPS Signal Transmission: Noise Reduction Using Non–Resonant Lengths and Other Techiques", Proceedings of the IEEE Multi–Chip Module Conference, pp. 138–142, (1996).

Emeigh, R., et al., "Fully Integrated LVD Clock Generation/Distribution IC", IEEE Custom Integrated Circuits Conference, pp. 53–56, (1997).

Fusi, M.A., et al., "Differential Signal Transmission Through BackPlanes and Connectors", *Electronic Packaging and Production,* 36(3), pp. 27, 28, 30, 32, (1996).

Kushiyama, N., et al., "An Experimental 295 MHz CMOS 4K × 256 SRAM Using Bidirectional Read/Write Shared Sense Amps and Self–Timed Pulsed Word–Line Drivers", *IEEE Journal of Solid–State Circuits,* 30(11), pp. 1286–1290, (Nov. 1995).

Kushiyama, N., et al., "FP 18.3: A 295MHz CMOS 1M (×256) Embedded SRAM using Bi–directional Read/Write Shared Sense Amps and Self–Timed Pulsed Word–Line Drivers", IEEE International Solid State Circuits Conference, 3 pages, (1995).

Li, C.S., et al., "Fully Differential Optical Interconnects For High–Speed Digital Systems", IEEE International Conference on Computer Design: VLSI in Computers & Processors, pp. 190–193, (1992).

Olsen, C.M., et al., "Differential Board/Backplane Optical Interconnects for High–Speed Digital Systems Part II: Simulation Results", *IEEE Journal of Lightwave Technology,* 11(7), pp. 1250–1262, (1993).

Rabaey, J.M., *Digital Integrated Circuits—A Design Perspective,* Prentice Hall, Upper Saddle River, New Jersey, pp. 482–493, (1996).

Seevinck, E., et al., "Current–Mode Techniques for High–Speed VLSI Circuits with Application to Current Sense Amplifier for CMOS SRAM's", *Journal of Solid State Circuits,* 26(4), 525–535, (Apr. 1991).

* cited by examiner

DIFFERENTIAL RECEIVERS IN A CMOS PROCESS

FIELD OF THE INVENTION

The present invention relates generally to electronic circuits. More particularly, it pertains to structures and methods for novel low power differential receivers in a CMOS process.

BACKGROUND OF THE INVENTION

The metal lines over insulators and ground planes, or metal lines buried in close proximity to dielectric insulators and used for integrated circuit interconnects are in reality transmission lines or strip lines. The use of coaxial interconnection lines for interconnections through the substrate in CMOS integrated circuits can also be termed transmission lines or strip lines. Interconnection lines on interposers or printed circuit boards can also be described as transmission lines.

In high density integrated circuits capacitive coupling and mutual inductance between closely packed transmission lines hinders the accuracy of signal detection. Differential transmission lines, with fully differential signals result in much less coupling due to stray capacitance and mutual inductance with other signal, control and/or clock lines. However, as will be shown, differential transmission lines in and of themselves cannot fully alleviate the high density integrated circuit signal detection problem.

Most CMOS integrated circuit interconnections rely on the transmission of a voltage step or signal across transmission lines. The driver on one end of the transmission line may simply be a CMOS inverter and the receiver a simple CMOS amplifier, differential amplifier or comparator. A voltage sense amplifier serving as the CMOS receiver presents a high impedance termination or load to the interconnection line. Most commonly used coaxial transmission lines have an impedance of only 50 ohms or 75 ohms. This fact is problematic for several identifiable reasons. In example, the high impedance termination is troublesome because the switching time response or signal delay is determined mainly by the ability of the driver to charge up the capacitance of the transmission line to neighboring transmission lines or conducting substrates as well as the load capacitance of the voltage sense amplifier. Switching times in CMOS circuits are similarly limited by the ability to switch the capacitive loads of long lines and buffers, and charge these capacitances over large voltage swings to yield a voltage step signal. Also, the transmission line is generally not terminated by its characteristic impedance (i.e. impedance matched) resulting in reflections and ringing. Large noise voltages may be induced on the signal transmission line due to capacitive coupling and large voltage switching on adjacent lines. This noise voltage can in fact be a large fraction of the signal voltage. In CMOS technology, the prior art, for the most part, does not impedance match transmission lines. This is due to the fact that impedance matching low impedance transmission lines is difficult to achieve in CMOS technology.

In contrast, transmission lines are generally impedance matched in ECL circuits. Low impedance resistor terminations are more easily achievable in a bipolar process. The result is that ECL gates have very low input impedances (Zin) looking back into the emitters of the emitter follower inputs (Zin=1/gm). Bipolar transistors have a large transconductance gm=(q/kT) (Idc) determined by the dc emitter current (Idc) so a low impedance is easily achieved, either in matching the sending or receiving end impedances. Matched transmission lines provide better noise immunity with smaller voltage swings on the lines. Unfortunately, ECL circuits consume large amounts of power and are not applicable in a strictly CMOS process.

Similar impedance matched terminations are used in hybrid BiCMOS circuits where bipolar technology resistors are commonly available and can be used for termination. As an example, in high frequency circuits, clock skew can be avoided by using terminated transmission lines for clock synchronization signals. In this example, a BiCMOS technology was utilized and resistors used to provide matching termination on the clock distribution lines. BiCMOS circuits, however, are not applicable to the pure CMOS process steps used in memory circuit fabrication.

The problem remains that it is difficult to impedance match the DRAM voltage sense amplifier to the low characteristic impedance of high speed CMOS transmission lines. Conventionally, impedance matching such transmission lines requires the use of very large width devices. The impedance looking into a CMOS source follower transistor is given by Zin=1/gm. In order to obtain the large values of gm which are needed to yield low input impedances of 50 Ohms, devices with width to length ratios (W/L) on the order of several hundred are necessary. Having such a large width to length ratio not only consumes precious chip surface area but once again increases power requirements.

For the reasons stated above, and for other reasons stated below which will become apparent to those skilled in the art upon reading and understanding the present specification, it is desirable to develop improved differential receivers which can be fabricated according to a CMOS process and which can operate at low power supply voltages.

SUMMARY OF THE INVENTION

The above mentioned problems with differential receivers as well as other problems are addressed by the present invention and will be understood by reading and studying the following specification.

A novel differential receiver designed for current signaling is provided to better impedance match high speed low impedance transmission lines. Low impedance transmission lines such as those which exist on CMOS integrated circuits are more amenable to current signaling over longer transmission lines. The new receiver of the present invention can match the low impedance of transmission lines while keeping the sizes of devices small and the power dissipation low.

A first embodiment of the differential receiver includes a pair of cross coupled amplifiers. Each amplifier includes a first transistor of a first conductivity type which has a source region, a drain region, and a gate opposing a body region. Each amplifier has a second transistor of a second conductivity type which has a source region, a drain region, and a gate opposing a body region. A signal input node is coupled to the source region for the first transistor. A signal output node is coupled to the drain regions for the first transistor and the second transistor. The novel differential receiver further includes a third transistor of a first conductivity type which has a source region, a drain region, and a gate opposing a body region. The signal input node for each amplifier is coupled to the gate of the third transistor. The drain region of this third transistor is coupled to a positive voltage supply and the source region is coupled to a lower voltage potential. The drain region of the third transistor is also coupled to the gate of the first transistor. The novel receiver employs feedback to decrease the input impedance of the receiver.

A second embodiment includes a method of operation for the novel differential receiver. The method includes receiving a first current signal from a first transmission line into a signal input of a first amplifier in the differential receiver. A second current signal is received from a second transmission line into a signal input of a second amplifier in the differential receiver. The second amplifier is cross coupled to the first amplifier. An input impedance to the signal input on the first amplifier and the second amplifier is impedance matched with a characteristic impedance of the first transmission line and the second transmission line.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1:
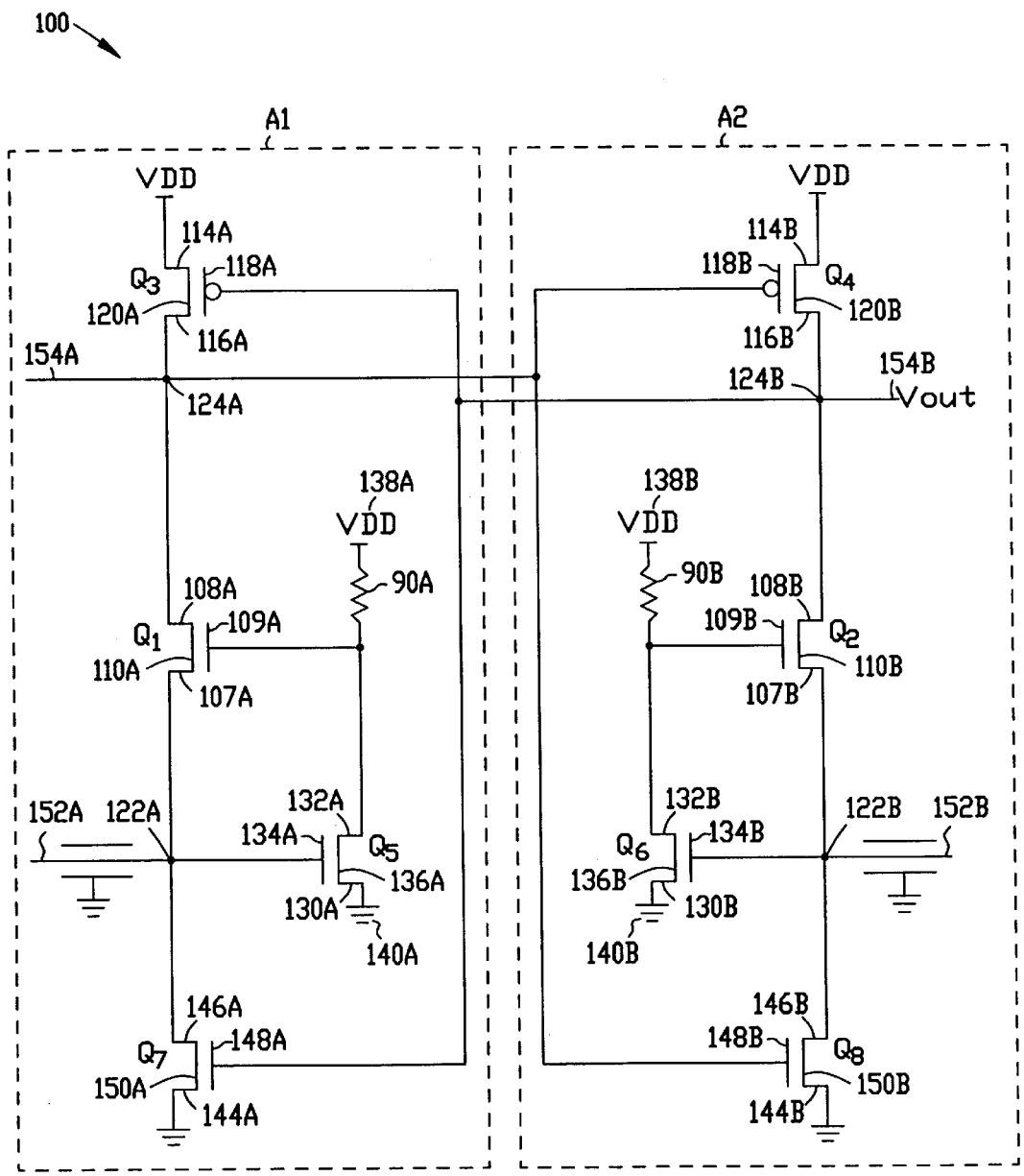
FIG. 1 is a schematic diagram illustrating an embodiment of a differential amplifier according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

In particular, an illustrative embodiment of the present invention includes a differential receiver. The differential receiver includes a cross coupled pair of cascode amplifiers. The differential receiver includes a first transmission line which is coupled to a first signal input for the differential receiver. The first signal input has an input impedance ($Z_{in}$) which matches a characteristic impedance ($Z_o$) of the first transmission line. A second transmission line is coupled to a second signal input for the differential receiver. The second signal input has an input impedance ($Z_{in}$) which matches a characteristic impedance ($Z_o$) of the second transmission line.

In another embodiment, a differential receiver is provided. The differential receiver includes a pair of cross coupled amplifiers. Each one of the cross coupled amplifiers includes a first transistor of a first conductivity type which has a source region, a drain region, and a gate opposing a body region. Each one of the cross coupled amplifiers includes a second transistor of a second conductivity type which similarly has a source region, a drain region, and a gate opposing a body region. A signal input node is coupled to the source region for the first transistor. A signal output node is coupled to the drain regions for the first transistor and the second transistor. A third transistor of a first conductivity type is included. The third transistor has a source region, a drain region, and a gate opposing a body region. The signal input node is coupled to the gate of the third transistor. The drain region is coupled to a positive voltage supply and the source region is coupled to a lower potential. The drain region is further coupled to the gate of the first transistor.

In one embodiment, the first transistor of a first conductivity type includes an n-channel metal-oxide semiconductor (NMOS) transistor and the second transistor of a second conductivity type includes a p-channel metal-oxide semiconductor (PMOS) transistor. In one embodiment, each amplifier in the amplifying circuit includes a fourth transistor of a first conductivity type which has a source region, a drain region, and a gate opposing a body region. The drain region of the fourth transistor is coupled to the source region for the first transistor.

In one embodiment, a first transmission line is coupled to the signal input node of a first one of the pair of cross coupled CMOS amplifiers and a second transmission line is coupled to the signal input of a second one of the pair of cross coupled CMOS amplifiers.

In another embodiment, a current sense amplifier is provided. The differential receiver includes a pair of cross coupled CMOS amplifiers. Each one of the cross coupled amplifiers includes a first n-channel metal oxide semiconductor (NMOS) transistor. Each one of the amplifiers includes a p-channel metal oxide semiconductor (PMOS) transistor. A signal input node is coupled to the source region for the first NMOS transistor. A signal output node is coupled to the drain regions for the first NMOS transistor and the PMOS transistor. A second NMOS transistor is included. The signal input node is coupled to a gate of the second NMOS transistor. The drain region is coupled to a positive voltage supply and the source region is coupled to a lower potential. The drain region is further coupled to a gate of the first NMOS transistor. A third NMOS transistor is included in each amplifier. A drain region for the third NMOS transistor is coupled to the source region for the first NMOS transistor in each amplifier. The signal output node for each amplifier is cross coupled to a gate of the PMOS transistor and the third NMOS transistor on the other amplifier.

In another embodiment, an electronic system is provided. The electronic system includes a central processing unit and a random access memory. A system bus communicatively couples the central processing unit and the random access memory. The random access memory (RAM) includes a current sense amplifier. The current sense amplifier includes a pair of cross coupled amplifiers. Each amplifier has a first transistor of a first conductivity type which has a source region, a drain region, and a gate opposing a body region. A second transistor of a second conductivity type which has a source region, a drain region, and a gate opposing a body region. A signal input node is coupled to the source region for the first transistor. A signal output node is coupled to the drain regions for the first transistor and the second transistor. A third transistor of a first conductivity type which has a source region, a drain region, and a gate opposing a body region. The signal input is coupled to the gate of the third transistor. The drain region is coupled to a positive voltage supply and the source region is coupled to a lower potential. The drain region is further coupled to the gate of the first transistor.

In another embodiment, a method of operation for a differential receiver is provided. The method includes receiving a first current signal from a first transmission line into a signal input on a first amplifier. The method further includes receiving a second current signal from a second transmission line into a signal input on a second amplifier, wherein the second amplifier is cross coupled to the first amplifier. An input impedance for the signal input on the first amplifier and the second amplifier is impedance matched with a characteristic impedance of the first transmission line and the second transmission line.

In another embodiment, a method for amplifying electronic signals over transmission lines is provided. The method includes receiving a first current signal from a first transmission line into a first signal input on a current sense amplifier. A second current signal is received from a second transmission line into a second signal input on the current sense amplifier. The method includes reducing an input impedance into the first signal input using a feedback driven by the first current signal from the first transmission line. The method further includes reducing an input impedance into the second signal input using a feedback driven by the second signal from the second transmission line.

In another embodiment, a method for sensing current signals is provided. The method includes receiving a first current signal from a first transmission line into a first signal input on a current sense amplifier. A second current signal is received from a second transmission line into a second signal input on the current sense amplifier. The current sense amplifier includes a pair of cross coupled CMOS amplifiers. Each CMOS amplifier includes a first transistor of a first conductivity type which has a source region, a drain region, and a gate opposing a body region. A second transistor of a second conductivity type which has a source region, a drain region, and a gate opposing a body region. A signal input node is coupled to the source region for the first transistor. A signal output node is coupled to the drain regions for the first transistor and the second transistor. Also, a third transistor of a first conductivity type is included. The third transistor has a source region, a drain region, and a gate opposing a body region. The signal input is coupled to the gate of the third transistor. The drain region is coupled to a positive voltage supply and the source region is coupled to a lower potential. The drain region of the third transistor is further coupled to the gate of the first transistor.

In one embodiment, receiving a first current signal from a first transmission line into a first signal input on a current sense amplifier includes using a feedback driven by the first current signal in order to reduce the input impedance to the first signal input. In this embodiment, receiving the second current signal from a second transmission line into a second signal input on the current sense amplifier includes using a feedback driven by the second current signal to reduce the input impedance to the second signal input.

In another embodiment, a method of forming a differential receiver is provided. The method includes cross coupling a pair of CMOS amplifiers. Each CMOS amplifier includes a first transistor of a first conductivity type which has a source region, a drain region, and a gate opposing a body region is provided in each CMOS amplifier. Each CMOS amplifier includes a second transistor of a second conductivity type which has a source region, a drain region, and a gate opposing a body region. A signal input node is coupled to the source region for the first transistor. A signal output node is coupled to the drain regions for the first transistor and the second transistor. A third transistor of a first conductivity type which has a source region, a drain region, and a gate opposing a body region. The signal input is coupled to the gate of the third transistor. The drain region is coupled to a positive voltage supply and the source region is coupled to a lower potential. The drain region is further coupled to the gate of the first transistor. The method includes coupling a first transmission line to the signal input node for a first one of the pair of CMOS amplifiers. The method also includes coupling a second transmission line to the signal input node for a second one of the pair of CMOS amplifiers.

In an alternate embodiment, a method of forming a current sense amplifier is provided. The method includes cross coupling a pair of CMOS amplifiers. Each CMOS amplifier includes a first transistor of a first conductivity type which has a source region, a drain region, and a gate opposing a body region. Each CMOS amplifier includes a second transistor of a second conductivity type which has a source region, a drain region, and a gate opposing a body region. A signal input node is coupled to the source region for the first transistor. A signal output node is coupled to the drain regions for the first transistor and the second transistor. The method further includes coupling a third transistor of a first conductivity type in each CMOS amplifier. The third transistor has a source region, a drain region, and a gate opposing a body region. Coupling the third transistor in each CMOS amplifier includes coupling the gate of each third transistor to the signal input node in each CMOS amplifier. The drain region is coupled to a positive voltage supply and the source region is coupled to a lower voltage potential. The drain region is further coupled to the gate of the first transistor for each CMOS amplifier.

In another embodiment, a method of forming a differential receiver is provided. The method includes cross coupling a pair of CMOS amplifiers. Each one of the cross coupled amplifiers includes a first n-channel metal oxide semiconductor (NMOS) transistor. Each one of the amplifiers includes a p-channel metal oxide semiconductor (PMOS) transistor. A signal input node is coupled to the source region for the first NMOS transistor. A signal output node is coupled to the drain regions for the first NMOS transistor and the PMOS transistor. A second NMOS transistor is included. The signal input node is coupled to a gate of the second NMOS transistor. The drain region is coupled to a positive voltage supply and the source region is coupled to a lower potential. The drain region is further coupled to a gate of the first NMOS transistor. The method includes coupling a first transmission line to the signal input node for a first one of the pair of CMOS amplifiers. The method also includes coupling a second transmission line to the signal input node for a second one of the pair of CMOS amplifiers.

Another embodiment includes a method for forming a current sense amplifier. The method includes cross coupling a pair of CMOS amplifiers. The method includes coupling a first transmission line to a first signal input for the cross coupled pair of CMOS amplifiers. Coupling a first transmission line to the first signal input includes coupling a first transmission line to a first signal input which has an input impedance (Zin) that matches a characteristic impedance (Zo) of the first transmission line. The method further includes coupling a second transmission line to a second signal input for cross coupled pair of CMOS amplifiers. Coupling a second transmission line to the second signal input includes coupling a second transmission line to a second signal input which has an input impedance (Zin) that matches a characteristic impedance (Zo) of the second transmission line.

Figure 9:
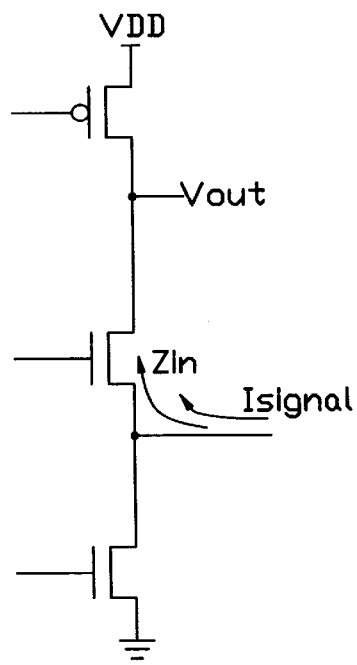
FIG. 9 illustrates a conventional cascode amplifier which comprises a portion of a conventional current sense amplifier.
Figure 10:
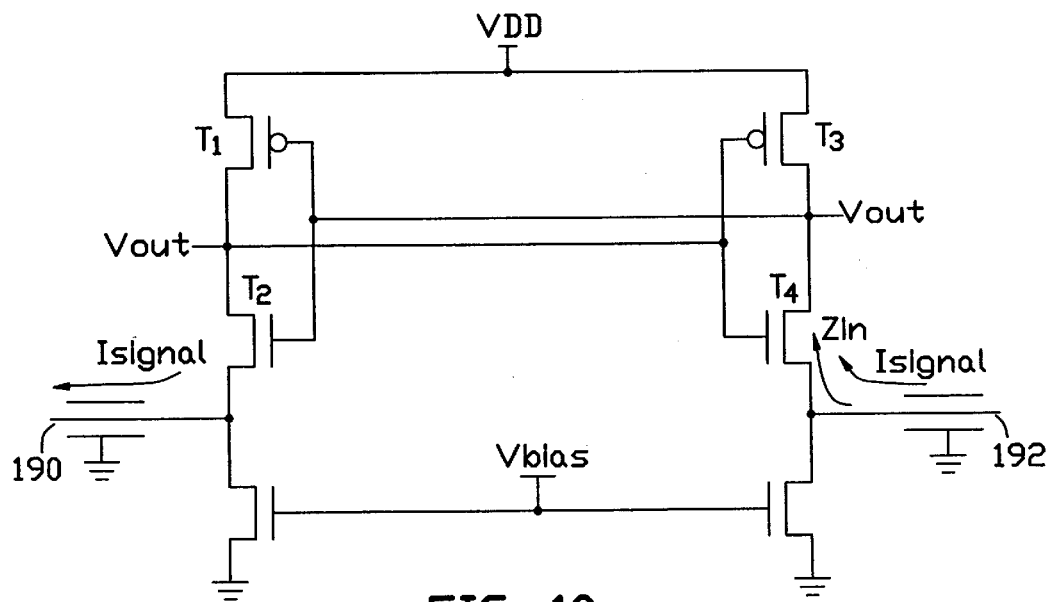
FIG. 10 illustrates a conventional current sense amplifier found according to the prior art.

FIG. 9 illustrates a conventional cascode amplifier which comprises a portion of a conventional current sense amplifier, shown in FIG. 10. As is shown by FIG. 10 the conventional current sense amplifier includes a pair of cross coupled inverters. FIG. 10 illustrates that an output node on one of the pair of cross coupled inverter is coupled to the gates for a p-channel metal oxide semiconductor (PMOS) transistor and an n-channel metal oxide semiconductor (NMOS) transistor. In FIG. 10, the cross coupling arrangement involves $T_1$, $T_2$, $T_3$ and $T_4$ respectively. Transistors $T_2$ and $T_4$ are NMOS transistors. Transistors $T_1$ and $T_3$ are PMOS transistors. FIG. 10 illustrates a pair of input transmission lines coupled to the conventional current sense amplifier. When a conventional memory cell is read, the data contained in that cell is placed on the bit line associated with the cell. Each bit line includes a complementary bit line. In FIG. 10, a data cell bit line is given by bit line (B/L) 190 and a complementary bit line is given by bit line (B/L*) 192.

FIG. 1 is a schematic diagram which illustrates the novel differential receiver 100, amplifier circuit 100, differential transmission line receiver circuit 100, or current sense amplifier 100 of the present invention which can be contrasted to the above described conventional current sense amplifiers. FIG. 1 illustrates a pair of cross coupled CMOS amplifiers, A1 and A2. In the embodiment shown in FIG. 1, the pair of cross coupled CMOS amplifiers, A1 and A2, includes two cross coupled CMOS cascode amplifiers, A1 and A2. The pair of cross coupled amplifiers includes a first CMOS amplifier A1 and a second CMOS amplifier A2. In one embodiment, the pair of cross coupled CMOS amplifiers includes a pair of cross coupled line receivers, A1 and A2. The pair of cross coupled line receivers includes a first line receiver A1 and a second line receiver A2. Each amplifier, A1 and A2, includes a first transistor, Q1 and Q2 respectively, of a first conductivity type. Each first transistor Q1 and Q2 includes a source region, 107A and 107B respectively. Each first transistor Q1 and Q2 includes a drain region, 108A and 108B. Also, each first transistor Q1 and Q2 includes a gate, 109A and 109B, opposing a body region 10A and 10B. Each amplifier, A1 and A2, includes a second transistor Q3 and Q4 of a second conductivity type. Each second transistor Q3 and Q4 includes a source region, 114A and 114B respectively. Each second transistor Q3 and Q4 includes a drain region, 116A and 116B. Also, each second transistor Q3 and Q4 includes a gate, 118A and 118B, opposing a body region 120A and 120B. In one embodiment, each first transistor, Q1 and Q2, of a first conductivity type includes an n-channel metal-oxide semiconductor (NMOS) transistor. In this embodiment, each second transistor, Q3 and Q4, of a second conductivity type includes a p-channel metal-oxide semiconductor (PMOS) transistor.

As shown in FIG. 1, each amplifier in the pair of cross coupled amplifiers A1 and A2 includes a signal input node, 122A and 122B, coupled to the source region 107A and 107B for the first transistor Q1 and Q2. A signal output node 124A and 124B is coupled to the drain regions 108A and 108B of the first transistors Q1 and Q2 as well as to the drain regions 116A and 116B of each second transistor Q3 and Q4.

Further, a third transistor, Q5 and Q6 respectively, is included in each of the amplifiers A1 and A2. Each third transistor, Q5 and Q6, includes a source region, 130A and 130B respectively. Each third transistor, Q5 and Q6, includes a drain region, 132A and 132B. Also, each third transistor, Q5 and Q6, includes a gate, 134A and 134B, opposing a body region 136A and 136B. The gate, 134A and 134B, of each third transistor, Q5 and Q6, is coupled to the signal input node, 122A and 122B, for each amplifier in the pair of cross coupled amplifiers A1 and A2. These third transistors, Q5 and Q6, are not present in the conventional current sense amplifier shown in Figure B. The drain region 132A and 132B for each third transistor Q5 and Q6 is coupled to a positive voltage supply, 138A and 138B. The source region 130A and 130B for each third transistor Q5 and Q6 is coupled to a lower potential, 140A and 140B. The drain region 132A and 132B for each third transistor Q5 and Q6 is additionally coupled to the gate 109A and 109B for each first transistor Q1 and Q2.

In the embodiment shown in FIG. 1, each amplifier, A1 and A2, includes a fourth transistor, Q7 and Q8 respectively, of a first conductivity type. Each fourth transistor Q7 and Q8 includes a source region, 144A and 144B respectively. Each fourth transistor Q7 and Q8 includes a drain region, 146A and 146B. Also, each fourth transistor Q7 and Q8 includes a gate, 148A and 148B, opposing a body region 150A and 150B. The drain region 146A and 146B for each fourth transistor, Q7 and Q8, is coupled to the signal input node, 122A and 122B, for each amplifier in the pair of cross coupled amplifiers A1 and A2.

In one embodiment, shown in FIG. 1, the signal output node 124A for first amplifier A1 is cross coupled to the gates 118B and 148B for the second transistor Q4 and the fourth transistor Q8 of the second amplifier A2. Similarly, the signal output node 124B for second amplifier A2 is cross coupled to the gates 118A and 148A for the second transistor Q3 and the fourth transistor Q7 of the first amplifier A1. This cross coupled configuration is distinguishable from the cross coupling arrangement of the conventional current sense amplifier shown in Figure B.

In one embodiment, each signal input node, 122A and 122B, for each amplifier in the pair of cross coupled amplifiers A1 and A2 is coupled to an input transmission line, 152A and 152B respectively, which has a length of at least 500 micrometers ($\mu$m). In another embodiment, each signal input node, 122A and 122B, for each amplifier in the pair of cross coupled amplifiers A1 and A2 is coupled to an input transmission line, 152A and 152B respectively, which has a length of at least 1000 micrometers ($\mu$m). In one embodiment, each signal input node, 122A and 122B, in the pair of cross coupled amplifiers A1 and A2 is coupled to an input transmission line 152A and 152B which has a characteristic impedance (Zo) of less than 50 Ohms. In another embodiment, each signal input node, 122A and 122B, in the pair of cross coupled amplifiers A1 and A2 is coupled to an input transmission line 152A and 152B which has a characteristic impedance (Zo) of less than 75 Ohms. In one embodiment, each signal input node, 122A and 122B, in the pair of cross coupled amplifiers A1 and A2 has an input impedance (Zin) which matches the characteristic impedance (Zo) of a transmission line 152A and 152B coupled respectively to each signal input node 122A and 122B.

FIG. 1 can be used to illustrate an operational embodiment of the differential receiver 100 in connection with a DRAM array. In example, when a conventional memory cell is read, the data contained in that cell is placed on a bit line associated with the cell. Each bit line includes a complementary bit line. In the embodiment of FIG. 1, the bit line and complementary bit line are represented by transmission lines 152A and 152B. In FIG. 1, by way of illustration and not for limitation, the data cell bit line is illustrated by transmission line 152A and the complementary bit line is illustrated by transmission line 152B. In FIG. 1, the cross coupled pair of amplifiers A1 and A2 includes transistors, Q1, Q2, Q3, Q4, Q5, Q6, Q7, and Q8 respectively. Transistors Q1 and Q2 are NMOS transistors. Transistors Q3 and Q4 are PMOS transistors. A pair of output transmission lines, shown as 154A and 154B in FIG. 1, are coupled to the signal output nodes 124A and 124B for the differential receiver 100. During a read cycle, the output transmission lines 154A and 154B are precharged to some fractional voltage of VDD, hence, placing a positive voltage on transmission lines 154A and 154B. This positive voltage is passed to the gates of NMOS transistors, Q1 and Q2, turning them on. Activation of NMOS transistors, Q1 and Q2, permits conduction between source regions 107A and 107B and the drain regions 108A and 108B in transistors Q1 and Q2. Conduction in transistors Q1 and Q2 couple input transmission lines 152A and 152B with output transmission lines, 154A and 154B respectively. As described above, output line 154A which is coupled to the signal output node 124A for first amplifier A1 is also cross coupled to the gates 118B and 148B for the second transistor Q4 and the fourth transistor Q8 of the second amplifier A2. Likewise, output transmission line 154B which is coupled to the signal output node 124B for second amplifier A2 is similarly cross coupled to the gates 118A and 148A for the second transistor Q3 and the fourth transistor Q7 of the first amplifier A1. If input transmission line 152A carries a logic state "0", the cross-coupled structure will cause the gate of PMOS transistor Q4 to go low, turning on transistor Q4. Activating transistor Q4 permits conduction between source region 114B and the drain region 116B in PMOS transistor Q4. Conduction in transistor Q4 couples a high voltage level VDD to output transmission line 154B. The presence of a high voltage or enhanced voltage on output transmission line 154B and the cross-coupled nature of the amplifiers A1 and A2 affects the gate in PMOS transistor Q3, forcing PMOS transistor Q3 to turn off. Simultaneously, the fourth transistor Q7 in the first amplifier A1 is turned "on" with the effect of latching the logic state "0" onto output transmission line 154A.

Alternatively, if transmission line 152A carried a logic state of "1", the cross-coupled nature of amplifiers A1 and A2 would force the gate of PMOS transistor Q4 to turn off. Meanwhile, the fourth transistor Q8 in the second amplifier A2 is turned "on" with the effect of latching a logic state "0" onto output transmission line 154B. The latched logic state "0" on output transmission line 154B will additionally latch "off" the fourth transistor Q7 and latch "on" the second transistor Q3 in the first amplifier A1. With the second transistor Q3 in the first amplifier A1 latched "on", the second transistor Q3 will conduct between source region 114A and the drain region 116A and couple a high voltage level VDD to output transmission line 154A.

As one of ordinary skill in the art will understand upon reading this disclosure, an input signal on either of the transmission lines 152A and/or 152B will drive the third transistors Q5 and Q6 which are in an operational mode providing a feedback to the gates 109A and 109B of the first transistors Q1 and Q2. The feedback to the gates 109A and 109B of the first transistors Q1 and Q2 will further enhance the conduction mode of the first transistors Q1 and Q2, thus reducing the input impedance (Zin) at the signal input nodes 122A and 122B. In this manner, the novel design of the differential receiver 100 of the present application is used to match the low impedance of input transmission lines 152A and 152B while keeping the sizes of the individual transistors, e.g. the width to length ratio (W/L) small. In addition, the power dissipation of the differential receiver 100 is reduced. In the embodiment shown in FIG. 1, load transistors 90A and 90B are shown coupled to the drain regions 132A and 132B for each third transistor Q5 and Q6, respectively. One of ordinary skill in the art will understand upon reading this disclosure, that load transistors 90A and 90B provide an embodiment of additional load impedance. The same is not intended to limit the scope of the present invention.

Figure 2:
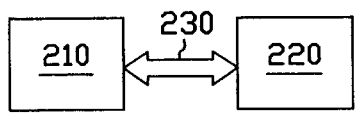
FIG. 2 is a block diagram illustrating an electronic system according to the teachings of the present invention.

FIG. 2 is a block diagram illustrating an electronic system 200 according to the teachings of the present invention. The electronic system includes a central processing unit 210 and a memory device 220, e.g. a random access memory (RAM). A bus 230 communicatively couples the central processing unit 210 and the memory device 220. In one embodiment, the bus 230 includes a system bus, a serial connection, or other buses. The memory device 220 further includes a differential receiver as described and presented in detail above in connection with FIG. 1. In one embodiment, each one of the pair of cross coupled amplifiers which make up the differential receiver includes a transmission line coupled to a signal input node on each amplifier. In this embodiment, the signal input node of each amplifier has an input impedance Zin which matches a characteristic impedance Zo of the transmission line coupled to that signal input node.

Figure 3:
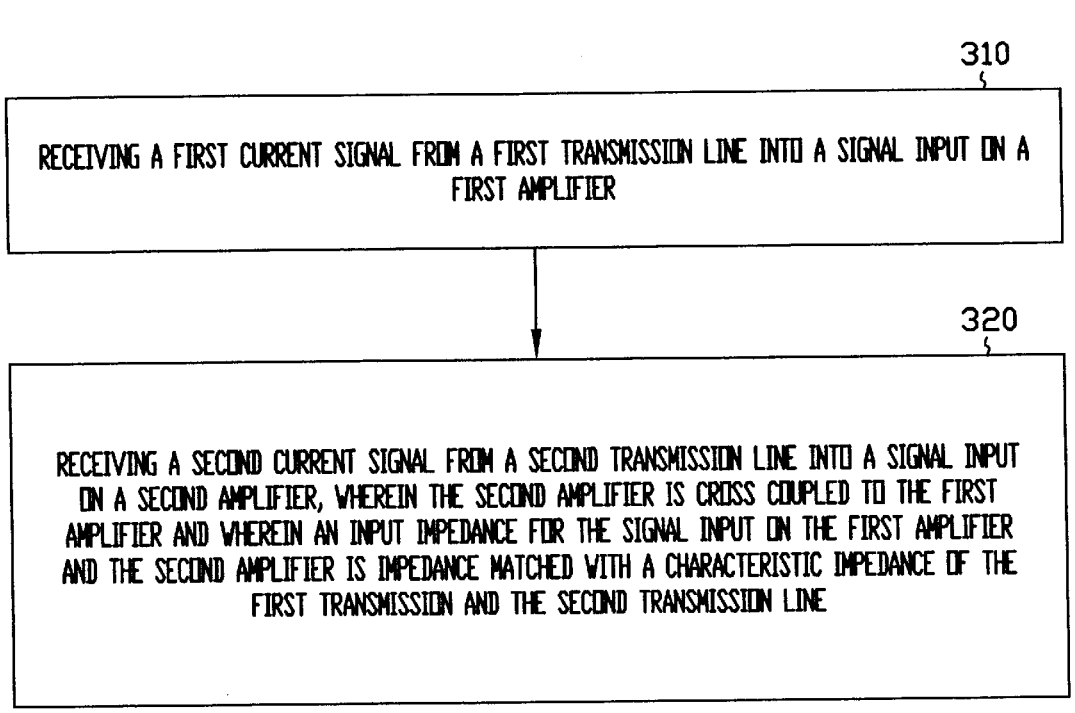
FIG. 3 illustrates, in flow diagram form, a method of operation for a differential receiver according to the teachings of the present invention.

FIG. 3 illustrates, in flow diagram form, a method of operation for a differential receiver according to the teachings of the present invention. The method includes receiving a first current signal from a first transmission line into a signal input on a first amplifier in the differential receiver 310. The method further includes receiving a second current signal from a second transmission line into a signal input on a second amplifier in the differential receiver 320. The second amplifier is cross coupled to the first amplifier, and an input impedance for each of the signal inputs on the first amplifier and the second amplifier is impedance matched with a characteristic impedance of the first transmission line and the second transmission line. In one embodiment, receiving a first current signal from a first transmission line includes reducing an input impedance into the signal input on the first amplifier using a feedback driven by the first current signal from the first transmission line. In one embodiment, receiving a second current signal from a second transmission line includes reducing an input impedance into the signal input on the second amplifier using a feedback driven by the second current signal from the second transmission line.

In still another embodiment of FIG. 3, each amplifier in the differential receiver is a CMOS amplifier. In this embodiment, each CMOS amplifier includes a first transistor of a first conductivity type which has a source region, a drain region, and a gate opposing a body region. Each CMOS amplifier includes a second transistor of a second conductivity type which has a source region, a drain region, and a gate opposing a body region. A signal input node is coupled to the source region for the first transistor. A signal output node is coupled to the drain regions for the first transistor and the second transistor. Further, each CMOS amplifier includes a third transistor of a first conductivity type which has a source region, a drain region, and a gate opposing a body region. The signal input node is coupled to the gate of the third transistor in each CMOS amplifier. The drain region of each third transistor is coupled to a positive voltage supply and the source region is coupled to a lower voltage potential. The drain region of each third transistor is additionally coupled to the gate of the first transistor.

Figure 4:
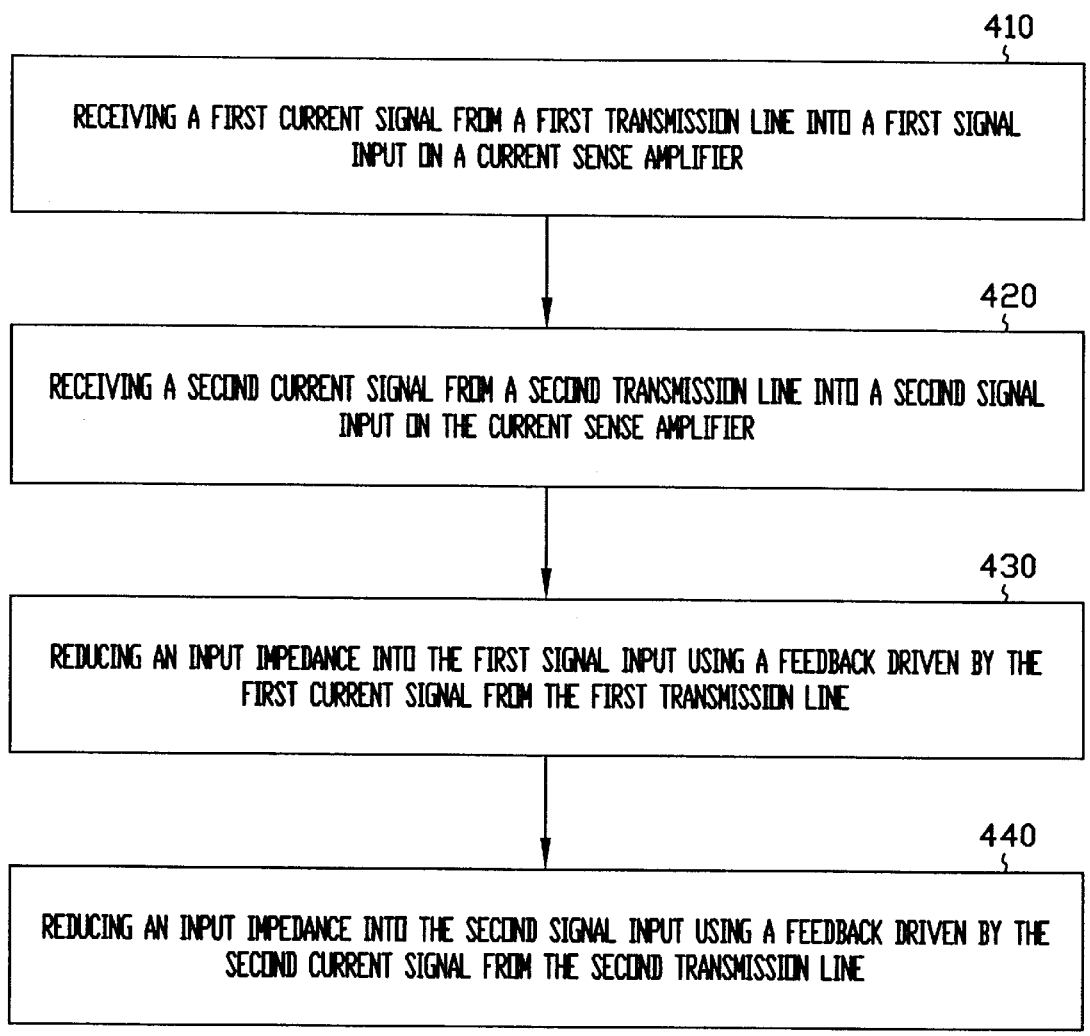
FIG. 4 illustrates, in flow diagram form, a method for amplifying electronic signals over transmission lines according to the teachings of the present invention.

FIG. 4 illustrates, in flow diagram form, a method for amplifying electronic signals over transmission lines according to the teachings of the present invention. The method includes receiving a first current signal from a first transmission line into a first signal input on a current sense amplifier 410. A second current signal is received from a second transmission line into a second signal input on the current sense amplifier 420. An input impedance into the first signal input is reduced using a feedback driven by the first current signal from the first transmission line 430. An input impedance into the second signal input is reduced using a feedback driven by the second signal from the second transmission line 440. In one embodiment of FIG. 4, receiving a first current signal from a first transmission line into a first signal input includes receiving the first current signal into a first signal input which has an input impedance (Zin) that matches a characteristic impedance for the first transmission line. In another embodiment, of FIG. 4, receiving a second current signal from a second transmission line into a second signal input includes receiving the second current signal into a second signal input which has an input impedance (Zin) that matches a characteristic impedance for the second transmission line.

Figure 5:
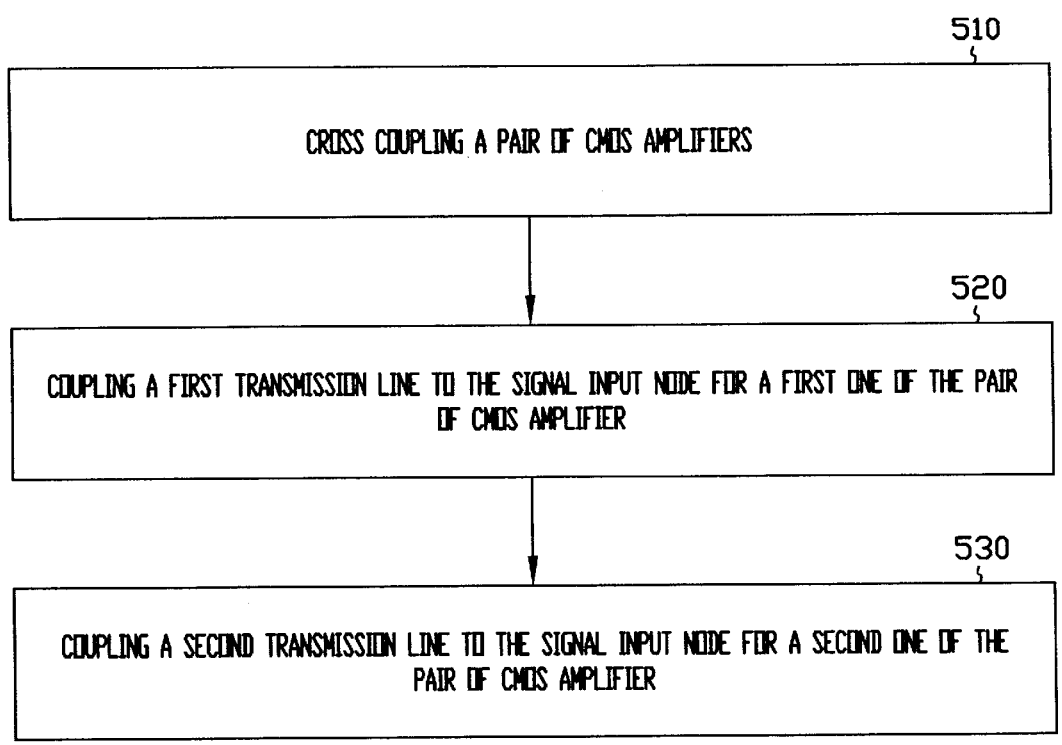
FIG. 5 illustrates, in flow diagram form, a method for forming a differential receiver according to the teachings of the present invention.

FIG. 5 illustrates, in flow diagram form, a method for forming a differential receiver according to the teachings of the present invention. The method includes cross coupling a pair of CMOS amplifiers 510. The method includes coupling a first transmission line to the signal input node for a first one of the pair of CMOS amplifiers 520. The method further includes coupling a second transmission line to the signal input node for a second one of the pair of CMOS amplifiers 530.

In one embodiment of FIG. 5, each CMOS amplifier includes a first transistor of a first conductivity type which has a source region, a drain region, and a gate opposing a body region. Each CMOS amplifier includes a second transistor of a second conductivity type which has a source region, a drain region, and a gate opposing a body region. A signal input node is coupled to the source region for the first transistor. A signal output node is coupled to the drain regions for the first transistor and the second transistor. Further, each CMOS amplifier includes a third transistor of a first conductivity type which has a source region, a drain region, and a gate opposing a body region. The signal input node is coupled to the gate of the third transistor in each CMOS amplifier. The drain region of each third transistor is coupled to a positive voltage supply and the source region is coupled to a lower voltage potential. The drain region of each third transistor is additionally coupled to the gate of the first transistor.

In another embodiment of FIG. 5, each CMOS amplifier includes a first n-channel metal oxide semiconductor (NMOS) transistor. Each one of the amplifiers includes a p-channel metal oxide semiconductor (PMOS) transistor. A signal input node is coupled to the source region for the first NMOS transistor. A signal output node is coupled to a drain region for the first NMOS transistor and the PMOS transistor. A second NMOS transistor is included. The signal input node is coupled to a gate of the second NMOS transistor. The drain region is coupled to a positive voltage supply and the source region is coupled to a lower potential. The drain region is further coupled to a gate of the first NMOS transistor.

Figure 6:
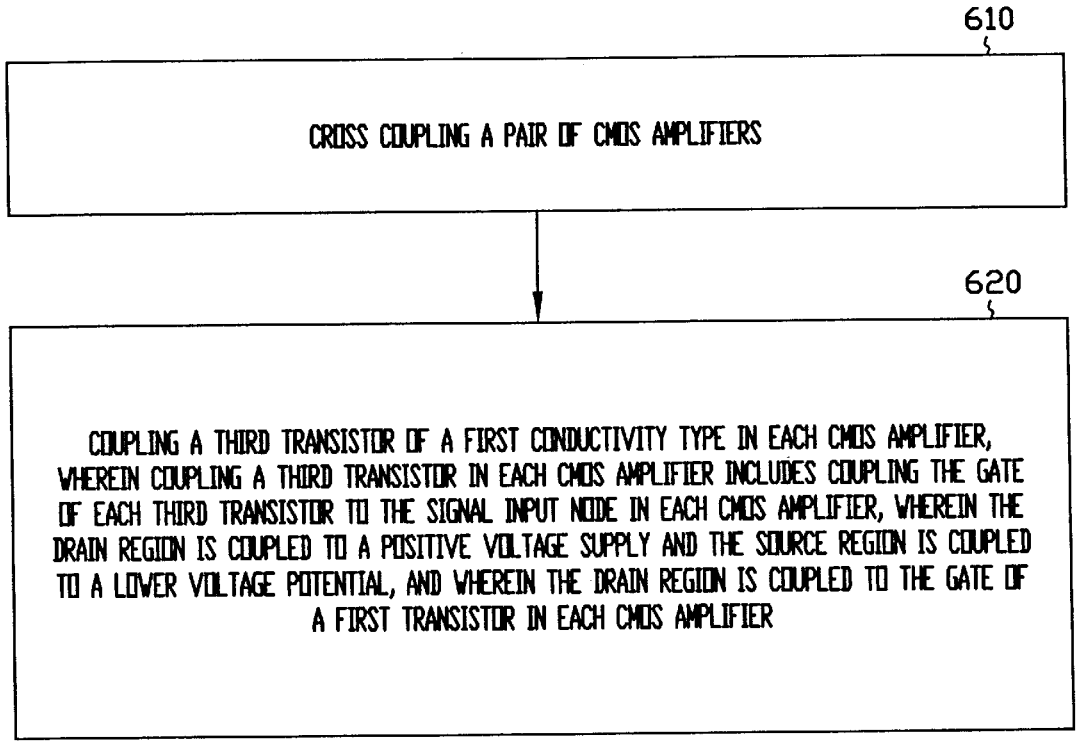
FIG. 6 illustrates, in flow diagram form, a method for forming a current sense amplifier according to the teachings of the present invention.

FIG. 6 illustrates, in flow diagram form, a method for forming a current sense amplifier according to the teachings of the present invention. The method includes cross coupling a pair of CMOS amplifiers 610. Each CMOS amplifier in the cross coupled pair includes a first transistor of a first conductivity type which has a source region, a drain region, and a gate opposing a body region. Each CMOS amplifier includes a second transistor of a second conductivity type which has a source region, a drain region, and a gate opposing a body region. A signal input node is coupled to the source region for the first transistor. A signal output node is coupled to the drain regions for the first transistor and the second transistor. The method further includes coupling a third transistor of a first conductivity type in each CMOS amplifier 620. Each third transistor has a source region, a drain region, and a gate opposing a body region. Coupling a third transistor in each CMOS amplifier includes coupling the gate of each third transistor to the signal input node in each cascode amplifier. The drain region is coupled to a positive voltage supply and the source region is coupled to a lower voltage potential. The drain region is also coupled to the gate of the first transistor for each CMOS amplifier. In one embodiment of FIG. 6, the method includes coupling a first transmission line to the signal input node for a first one of the pair of CMOS amplifiers. In this embodiment, the method further includes coupling a second transmission line to the signal input node for a second one of the pair of CMOS amplifiers.

In another embodiment of FIG. 6, cross coupling the pair of CMOS amplifiers includes cross coupling a pair of CMOS amplifiers which each include a fourth transistor of a first conductivity type which has a source region, a drain region, and a gate opposing a body region. The drain region of each fourth transistor is coupled to the source region of the first transistor. Cross coupling the pair of CMOS amplifiers includes cross coupling the signal output node for each amplifier to the gate of the second transistor and the fourth transistor on the other amplifier. In another embodiment of FIG. 6, cross coupling a pair of CMOS amplifiers includes cross coupling a pair of cascode amplifiers.

Figure 7:
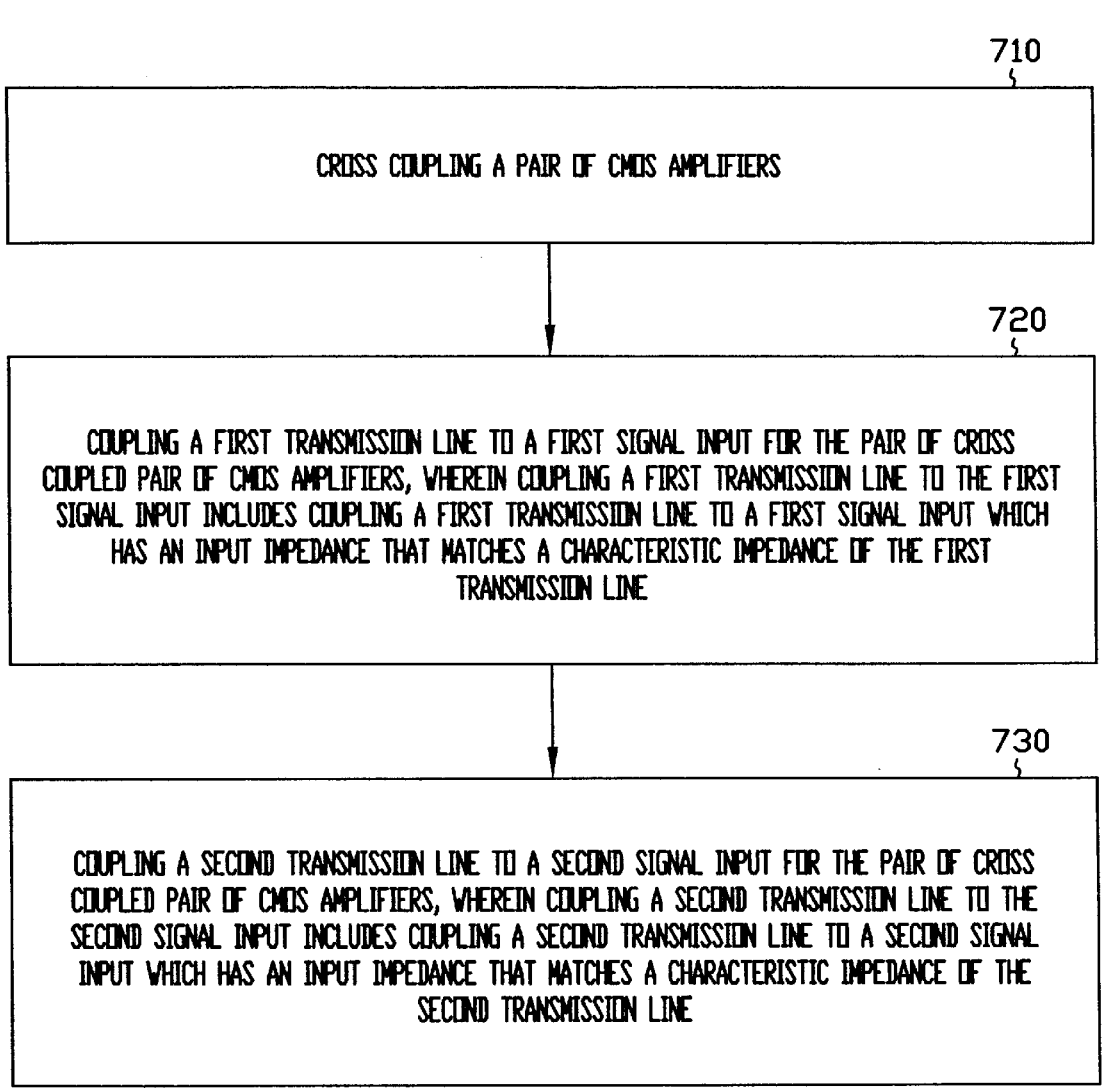
FIG. 7 illustrates, in flow diagram form, another embodiment for forming a differential receiver according to an embodiment of the present invention.

FIG. 7 illustrates, in flow diagram form, a method for forming a differential receiver according to the teachings of the present invention. The method includes cross coupling a pair of CMOS amplifiers 710. The method includes coupling a first transmission line to a first signal input for the cross coupled pair of CMOS amplifiers 720. Coupling a first transmission line to the first signal input includes coupling a first transmission line to a first signal input which has an input impedance (Zin) that matches a characteristic impedance (Zo) of the first transmission line. The method further includes coupling a second transmission line to a second signal input for the cross coupled pair of CMOS amplifiers 730. Coupling a second transmission line to the second signal input includes coupling a second transmission line to a second signal input which has an input impedance (Zin) that matches a characteristic impedance (Zo) of the second transmission line.

In one embodiment of FIG. 7, each CMOS amplifier includes a first n-channel metal oxide semiconductor (NMOS) transistor. Each one of the amplifiers includes a p-channel metal oxide semiconductor (PMOS) transistor. A signal input node is coupled to the source region for the first NMOS transistor. A signal output node is coupled to the drain regions for the first NMOS transistor and the PMOS transistor. A second NMOS transistor is included. The drain region of the second NMOS transistor is coupled to the source region for the first NMOS transistor.

In another embodiment of FIG. 7, coupling a first transmission line to a signal input node for a first one of the pair of CMOS amplifiers having an input impedance (Zin) which matches a characteristic impedance (Zo) of the first transmission line includes coupling the signal input node to a third NMOS transistor. Here, the signal input node is coupled to a gate of the third NMOS transistor. A drain region of the third NMOS transistor is coupled to a positive voltage supply and to a gate of the first NMOS transistor and a source region of the third NMOS is coupled to a lower voltage potential. In this embodiment, coupling a second transmission line to a signal input node for a second one of the pair of CMOS amplifiers having an input impedance (Zin) which matches a characteristic impedance (Zo) of the second transmission line includes coupling the signal input node to a third NMOS transistor. Again, the signal input node is coupled to a gate of the third NMOS transistor. A drain region of the third NMOS transistor is coupled to a positive voltage supply and to a gate of the first NMOS transistor, and a source region of the third NMOS is coupled to a lower voltage potential. In this embodiment, cross coupling a pair of CMOS amplifiers includes coupling the signal output node for each amplifier to a gate of the PMOS transistor and a gate of the second NMOS transistor on the other amplifier.

Figure 8:
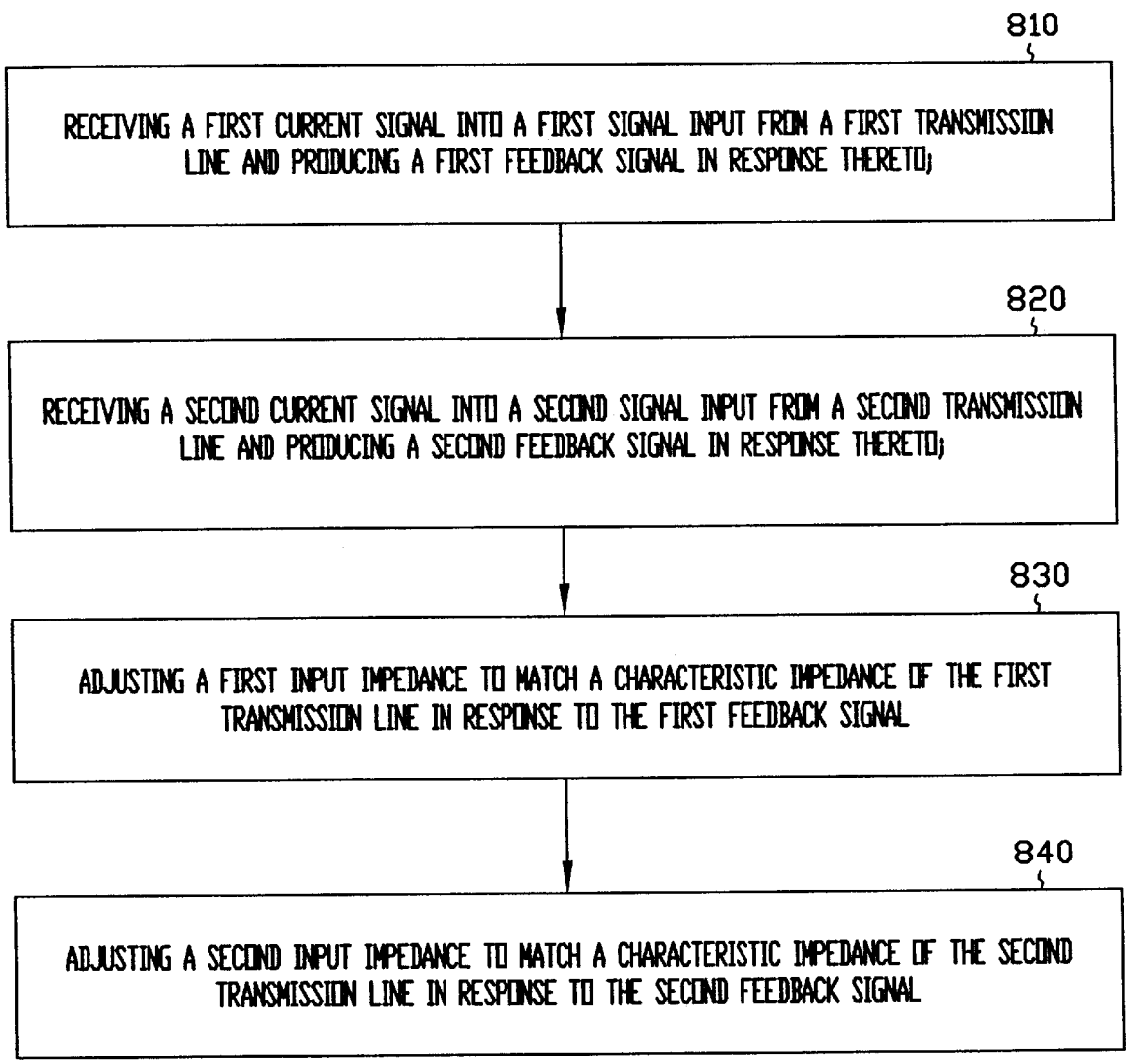
FIG. 8 illustrates, in flow diagram form, a method of terminating a differential transmission line according to the teachings of the present invention.

FIG. 8 illustrates, in flow diagram form, a method of terminating a differential transmission line according to the teachings of the present invention. The method includes receiving a first current signal into a first signal input from a first transmission line and producing a first feedback signal in response thereto 810. The method includes receiving a second current signal into a second signal input from a second transmission and producing a second feedback signal in response thereto 820. The method includes adjusting a first input impedance to match a characteristic impedance of the first transmission line in response to the first feedback signal 830. The method further includes adjusting a second input impedance to match a characteristic impedance of the second transmission line in response to the second feedback signal 840.

CONCLUSION

A novel structure and methods for an improved differential receiver have been described. The novel differential receiver is designed for current signaling in order to better impedance match high speed low impedance transmission lines. Low impedance transmission lines such as those which exist on CMOS integrated circuits are more amenable to current signaling over longer transmission lines. The novel receiver employs feedback to decrease the input impedance of the receiver. The new receiver of the present invention can match the low impedance of transmission lines while keeping the sizes of devices small and the power dissipation low.

A differential current signal will upset the balance in the differential receiver causing the receiver to amplify the signal and latch up with a large voltage signal output. The novel design facilitates the transmission of high speed signals over long distances with minimal ringing, reflections, noise and cross talk in integrated circuit interconnections.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A differential receiver, comprising:
    a pair of cross coupled amplifiers, wherein each amplifier comprises:
        a first transistor of a first conductivity type having a source region, a drain region, and a gate opposing a body region;
        a second transistor of a second conductivity type having a source region, a drain region, and a gate opposing a body region;
        a signal input node coupled to the source region for the first transistor;
        a signal output node coupled to the drain regions for the first transistor and the second transistor; and
        a third transistor of a first conductivity type having a source region, a drain region, and a gate opposing a body region, wherein the signal input node is coupled to the gate of the third transistor, the drain region is coupled to a positive voltage supply and the source region is coupled to a lower voltage potential, and wherein the drain region is coupled to the gate of the first transistor.

2. The differential receiver of claim 1, wherein the first transistor of a first conductivity type includes an n-channel metal-oxide semiconductor (NMOS) transistor, and wherein the second transistor of a second conductivity type includes a p-channel metal-oxide semiconductor (PMOS) transistor.

3. The differential receiver of claim 1, wherein each amplifier in the differential receiver includes a fourth transistor of a first conductivity type having a source region, a drain region, and a gate opposing a body region, wherein the drain region is coupled to the signal input node for the respective amplifier.

4. The differential receiver of claim 3, wherein the signal output node for each amplifier is cross coupled to the gate of the second transistor and the fourth transistor on the other amplifier.

5. The differential receiver of claim 1, wherein the signal input node for each amplifier is coupled to a respective transmission line which has a length of at least 500 micrometers ($\mu$m).

6. The differential receiver of claim 1, wherein the signal input node for each amplifier is coupled to a respective transmission line which has a characteristic impedance of less than 50 Ohms.

7. The differential receiver of claim 6, wherein each of the signal input nodes has an input impedance which matches the characteristic impedance of the respective transmission line.

8. An amplifier circuit, comprising:
   a pair of cross coupled CMOS amplifiers, wherein each amplifier comprises:
      a first transistor of a first conductivity type having a source region, a drain region, and a gate opposing a body region;
      a second transistor of a second conductivity type having a source region, a drain region, and a gate opposing a body region;
      a signal input node coupled to the source region for the first transistor;
      a signal output node coupled to the drain regions for the first transistor and the second transistor; and
      a third transistor of a first conductivity type having a source region, a drain region, and a gate opposing a body region, wherein the signal input node is coupled to the gate of the third transistor, wherein the drain region is coupled to a positive voltage supply and the source region is coupled to a lower voltage potential, and wherein the drain region is coupled to the gate of the first transistor;
   a first transmission line coupled to the signal input node of a first one of the pair of cross coupled CMOS amplifiers; and
   a second transmission line coupled to the signal input node of a second one of the pair of cross coupled CMOS amplifiers.

9. The amplifier circuit of claim 8, wherein the pair of cross coupled CMOS amplifiers includes a cross coupled pair of cascode amplifiers.

10. The amplifier circuit of claim 8, wherein the first transistor of a first conductivity type includes an n-channel metal-oxide semiconductor (NMOS) transistor, and wherein the second transistor of a second conductivity type includes a p-channel metal-oxide semiconductor (PMOS) transistor.

11. The amplifier circuit of claim 8, wherein each amplifier in the amplifying circuit includes a fourth transistor of a first conductivity type having a source region, a drain region, and a gate opposing a body region, wherein the drain region is coupled to the source region for the first transistor.

12. The amplifier circuit of claim 11, wherein the signal output node for each amplifier is cross coupled to the gate of the second transistor and the fourth transistor on the other amplifier.

13. The amplifier circuit of claim 8, wherein the first and the second transmission lines each have a length of at least 1000 micrometers ($\mu$m).

14. A current sense amplifier, comprising:
   a pair of cross coupled CMOS amplifiers, wherein each amplifier includes:
      a first n-channel metal-oxide semiconductor (NMOS) transistor;
      a p-channel metal-oxide semiconductor (PMOS) transistor;
      a signal input node coupled to a source region for the first NMOS transistor;
      a signal output node coupled to a drain region for the first NMOS transistor and the PMOS transistor;
      a second NMOS transistor, wherein a drain region for the second NMOS transistor is coupled to the source region for the first NMOS transistor, and wherein the signal output node for each amplifier is cross coupled to a gate of the PMOS transistor and the second NMOS transistor on the other amplifier; and
      a third NMOS transistor, wherein the signal input node is coupled to a gate of the third NMOS transistor, wherein a drain region for the third NMOS transistor is coupled to a positive voltage supply and a source region for the third NMOS transistor is coupled to a lower voltage potential than the drain region, and wherein the drain region for the third NMOS transistor is further coupled to a gate of the first NMOS transistor.

15. The current sense amplifier of claim 14, wherein each signal input node for the pair of cross coupled CMOS amplifiers is coupled to a respective transmission line.

16. The current sense amplifier of claim 14, wherein the signal input node for each amplifier is coupled to a respective transmission line which has a characteristic impedance of less than 50 Ohms.

17. The current sense amplifier of claim 14, wherein each signal input node includes an input impedance (Zin) of less than 50 Ohms.

18. An electronic system, comprising:
   a central processing unit;
   a random access memory; and
   a system bus coupling the central processing unit and the random access memory, the random access memory (RAM) including a current sense amplifier comprising a pair of cross coupled amplifiers, wherein each amplifier comprises:
      a first transistor of a first conductivity type having a source region, a drain region, and a gate opposing a body region;
      a second transistor of a second conductivity type having a source region, a drain region, and a gate opposing a body region;
      a signal input node coupled to the source region for the first transistor;
      a signal output node coupled to the drain regions for the first transistor and the second transistor; and
      a third transistor of a first conductivity type having a source region, a drain region, and a gate opposing a body region, wherein the signal input node is coupled to the gate of the third transistor, wherein the drain region is coupled to a positive voltage supply and the source region is coupled to a lower voltage potential, and wherein the drain region is coupled to the gate of the first transistor.

19. The electronic system of claim 18, wherein each amplifier includes a respective transmission line coupled to the signal input node.

20. The electronic system of claim 19, wherein each of the transmission lines has a characteristic impedance of less than 50 Ohms.

21. The electronic system of claim 19, wherein the signal input node of each amplifier has an input impedance (Zin) which matches a characteristic impedance (Zo) of the respective transmission line.

22. The electronic system of claim 18, wherein each respective amplifier further includes a fourth transistor of a first conductivity type having a source region, a drain region, and a gate opposing a body region, wherein the drain region of the respective fourth transistor is coupled to the signal input node for each respective amplifier.

23. The electronic system of claim 22, wherein the signal output node for each respective amplifier is cross coupled to the gate of the second transistor and the fourth transistor on the other respective amplifier.

24. A method of operation for a differential receiver, comprising:

receiving a first current signal from a first transmission line into a signal input of a first amplifier in the differential receiver;

reducing an input impedance (Zin) into the signal input on the first amplifier using a feedback driven by the first current signal from the first transmission line; and receiving a second current signal from a second transmission line into a signal input of a second amplifier in the differential receiver, wherein the second amplifier is cross coupled to the first amplifier;

reducing an input impedance (Zin) into the signal input on the second amplifier using a feedback driven by the second current signal from the second transmission line; and wherein an input impedance to the signal input on the first amplifier and the second amplifier is impedance matched with a characteristic impedance of the first transmission line and the second transmission line by using the feedback driven by the first and the second current signals from the first and the second transmission lines.

25. The method of claim 24, wherein receiving a first current signal from a first transmission line includes receiving the first current signal from a first transmission line which has a characteristic impedance (Zo) of less than 50 Ohms.

26. The method of claim 24, wherein receiving a second current signal from a second transmission line includes receiving the second current signal from a second transmission line which has a characteristic impedance (Zo) of less than 50 Ohms.

27. A method for amplifying electronic signals over transmission lines, comprising:

receiving a first current signal from a first transmission line into a first signal input on a current sense amplifier;

receiving a second current signal from a second transmission line into a second signal input on the current sense amplifier;

reducing an input impedance into the first signal input using a feedback driven by the first current signal from the first transmission line in order to match the impedance of the first signal input to a characteristic impedance of the first transmission line; and reducing an input impedance into the second signal input using a feedback driven by the second current signal from the second transmission line in order to match the impedance of the second signal input to a characteristic impedance of the second transmission line.

28. The method of claim 27, wherein receiving a first current signal from a first transmission line includes receiving a first current signal from a first transmission line which has a length of at least 1000 μm.

29. The method of claim 27, wherein receiving a second current signal from a second transmission line includes receiving a second current signal from a second transmission line which has a length of at least 1000 μm.

30. A method for sensing current signals, comprising:

receiving a first current signal from a first transmission line into a first signal input on a current sense amplifier; and receiving a second current signal from a second transmission line into a second signal input on the current sense amplifier; wherein the current sense amplifier includes a pair of cross coupled CMOS amplifiers, and wherein each CMOS amplifier includes:

a first transistor of a first conductivity type having a source region, a drain region, and a gate opposing a body region;

a second transistor of a second conductivity type having a source region, a drain region, and a gate opposing a body region;

a signal input node coupled to the source region for the first transistor;

a signal output node coupled to the drain regions for the first transistor and the second transistor; and a third transistor of a first conductivity type having a source region, a drain region, and a gate opposing a body region, wherein the signal input node is coupled to the gate of the third transistor, wherein the drain region is coupled to a positive voltage supply and the source region is coupled to a lower potential, and wherein the drain region is coupled to the gate of the first transistor.

31. The method of claim 30, wherein receiving a first current signal from a first transmission line into a first signal input on a current sense amplifier includes using a feedback driven by the first current signal in order to reduce an input impedance to the first signal input.

32. The method of claim 30, wherein receiving the second current signal from a second transmission line into a second signal input on the current sense amplifier includes using a feedback driven by the second current signal to reduce an input impedance to the second signal input.

33. The method of claim 30, wherein receiving a first current signal from a first transmission line into a first signal input includes receiving the first current signal into a first signal input which has an input impedance (Zin) of less than 75 Ohms.

34. The method of claim 30, wherein receiving a second current signal from a second transmission line into a second signal input includes receiving the second current signal into a second signal input which has an input impedance (Zin) of less than 75 Ohms.

35. A method of forming a differential receiver, comprising:

cross coupling a pair of CMOS amplifiers, wherein each CMOS amplifier includes:

a first transistor of a first conductivity type having a source region, a drain region, and a gate opposing a body region;

a second transistor of a second conductivity type having a source region, a drain region, and a gate opposing a body region;

a signal input node coupled to the source region for the first transistor;

a signal output node coupled to the drain regions for the first transistor and the second transistor; and a third transistor of a first conductivity type having a source region, a drain region, and a gate opposing a body region, wherein the signal input node is coupled to the gate of the third transistor, wherein the drain region is coupled to a positive voltage supply and the source region is coupled to a lower voltage potential, and wherein the drain region is coupled to the gate of the first transistor;

coupling a first transmission line to the signal input node for a first one of the pair of CMOS amplifiers; and coupling a second transmission line to the signal input node for a second one of the pair of CMOS amplifiers.

36. The method of claim 35, wherein coupling a first transmission line to the signal input node for a first one of the pair of CMOS amplifiers includes coupling a first transmission line having a characteristic impedance of less than 50 Ohms.

37. The method of claim 35, wherein coupling a second transmission line to the signal input node for a second one of the pair of CMOS amplifiers includes coupling a second transmission line having a characteristic impedance of less than 50 Ohms.

38. The method of claim 35, wherein cross coupling a pair of CMOS amplifiers includes cross coupling a pair of CMOS amplifiers each having an input impedance at the signal input node which matches a characteristic impedance of the first and second transmission lines.

39. The method of claim 35, wherein coupling a first transmission line includes coupling a first transmission line which has a length of at least 1000 μm.

40. The method of claim 35, wherein coupling a second transmission line includes coupling a second transmission line which has a length of at least 1000 μm.

41. A method of forming a current sense amplifier, comprising:
  cross coupling a pair of CMOS amplifiers, wherein each CMOS amplifier includes:
    a first transistor of a first conductivity type having a source region, a drain region, and a gate opposing a body region;
    a second transistor of a second conductivity type having a source region, a drain region, and a gate opposing a body region;
    a signal input node coupled to the source region for the first transistor; and
    a signal output node coupled to the drain regions for the first transistor and the second transistor; and
  coupling a respective third transistor of a first conductivity type in each respective CMOS amplifier, wherein each respective third transistor has a source region, a drain region, and a gate opposing a body region, wherein coupling the respective third transistor in the respective CMOS amplifier includes coupling the gate of the respective third transistor to the signal input node in the respective CMOS amplifier, wherein the drain region in the respective third transistor is coupled to a positive voltage supply and the source region is coupled to a lower voltage potential, and wherein the drain region in the respective third transistor is coupled to the gate of the first transistor for the respective CMOS amplifier.

42. The method of claim 41, wherein cross coupling a pair of CMOS amplifiers includes cross coupling a pair of cascode amplifiers.

43. The method of claim 41, wherein the method further includes coupling a first transmission line to the signal input node for a first one of the pair of cross coupled CMOS amplifiers.

44. The method of claim 43, wherein the method further includes coupling a second transmission line to the signal input node for a second one of the pair of cross coupled CMOS amplifiers.

45. The method of claim 41, wherein cross coupling a pair of CMOS amplifiers includes cross coupling a pair of CMOS amplifiers wherein each CMOS amplifier includes a fourth transistor of a first conductivity type having a source region, a drain region, and a gate opposing a body region, and wherein the drain region is coupled to the source region for the first transistor.

46. The method of claim 45, wherein cross coupling the pair of CMOS amplifiers includes cross coupling the signal output node for each respective amplifier to the gate of the second transistor and the fourth transistor on the other respective amplifier.

47. A method of forming a differential receiver, comprising:
  cross coupling a pair of CMOS amplifiers, wherein each CMOS amplifier includes:
    a first n-channel metal-oxide semiconductor (NMOS) transistor;
    a p-channel metal-oxide semiconductor (PMOS) transistor;
    a signal input node coupled to a source region for the first NMOS transistor;
    a signal output node coupled to a drain region for the first NMOS transistor and the PMOS transistor; and
    a second NMOS transistor, wherein the signal input node is coupled to a gate of the second NMOS transistor, wherein a drain region is coupled to a positive voltage supply and a source region is coupled to a lower voltage potential, and wherein the drain region is coupled to a gate of the first NMOS transistor;
  coupling a first transmission line to the signal input node for a first one of the pair of CMOS amplifiers; and
  coupling a second transmission line to the signal input node for a second one of the pair of CMOS amplifiers.

48. The method of claim 47, wherein coupling a first transmission line to the signal input node for a first one of the pair of CMOS amplifiers includes coupling a first transmission line to a signal input node which has an input impedance (Zin) which matches a characteristic impedance (Zo) of the first transmission line.

49. The method of claim 47, wherein coupling a second transmission line to the signal input node for a second one of the pair of CMOS amplifiers includes coupling a second transmission line to a signal input node which has an input impedance (Zin) which matches a characteristic impedance (Zo) of the second transmission line.

50. The method of claim 47, wherein cross coupling a pair of CMOS amplifiers includes cross coupling a pair of CMOS amplifiers wherein each amplifier includes a third NMOS transistor, wherein a drain region for each third NMOS transistor is coupled to the source region for the first NMOS transistor.

51. The method of claim 50, wherein cross coupling the pair of CMOS amplifiers includes cross coupling the signal output node for each amplifier to a gate of the PMOS transistor and the third NMOS transistor on the other amplifier.

52. A method for forming a current sense amplifier, comprising:
  cross coupling a pair of CMOS amplifiers, wherein each CMOS amplifier includes:
    a first n-channel metal-oxide semiconductor (NMOS) transistor;
    a p-channel metal-oxide semiconductor (PMOS) transistor;
    a signal input node coupled to a source region for the first NMOS transistor;
    a signal output node coupled to a drain region for the first NMOS transistor and a drain region for the PMOS transistor; and
    a second NMOS transistor, wherein a drain region is coupled to the source region for the first NMOS transistor;
  coupling a first transmission line to the signal input node for a first one of the pair of CMOS amplifiers and to a gate of a third NMOS transistor wherein a drain region of the third NMOS transistor is coupled to a positive voltage supply and to a gate of the first NMOS transistor in the first one of the pair of CMOS amplifiers, and wherein a source region of the third NMOS is coupled to a lower voltage potential, wherein coupling a first transmission line to the signal input node for a first one of the pair of CMOS amplifiers includes coupling a first transmission line to a signal input node which has an input impedance (Zin) that matches a characteristic impedance (Zo) of the first transmission line; and coupling a second transmission line to the signal input node for a second one of the pair of CMOS amplifiers, wherein coupling a second transmission line to the signal input node for a second one of the pair of CMOS amplifiers includes coupling a second transmission line to a signal input node which has an input impedance (Zin) which matches a characteristic impedance (Zo) of the second transmission line.

53. The method of claim 52, wherein coupling a second transmission line to a signal input node for a second one of the pair of CMOS amplifiers having an input impedance (Zin) which matches a characteristic impedance (Zo) of the second transmission line includes coupling the signal input node to a fourth NMOS transistor, wherein the signal input node is coupled to a gate of the fourth NMOS transistor, wherein a drain region of the fourth NMOS transistor is coupled to a positive voltage supply and to a gate of the first NMOS transistor in the second one of the pair of CMOS amplifiers, and wherein a source region of the fourth NMOS transistor is coupled to a lower voltage potential.

54. The method of claim 52, wherein cross coupling a pair of CMOS amplifiers includes coupling the signal output node for each respective amplifier to a gate of the PMOS transistor and a gate of the second NMOS transistor on the other respective amplifier.

55. A method of forming a differential receiver, comprising:
cross coupling a pair of CMOS amplifiers, wherein each CMOS amplifier includes:
a first n-channel metal-oxide semiconductor (NMOS) transistor;
a p-channel metal-oxide semiconductor (PMOS) transistor;
a signal input node coupled to a source region for the first NMOS transistor;
a signal output node coupled to a drain region for the first NMOS transistor and a drain region for the PMOS transistor;
a second NMOS transistor, wherein a drain region is coupled to the source region for the first NMOS transistor;
a third NMOS transistor, wherein the signal input node is coupled to a gate of the third NMOS transistor, wherein a drain region is coupled to a positive voltage supply and a source region is coupled to a lower voltage potential, and wherein the drain region is coupled to a gate of the first NMOS transistor;
coupling a first transmission line to the signal input node for a first one of the pair of CMOS amplifiers, wherein coupling a first transmission line to the signal input node for a first one of the pair of CMOS amplifiers includes coupling a first transmission line to a signal input node which has an input impedance (Zin) which matches a characteristic impedance (Zo) of the first transmission line; and coupling a second transmission line to the signal input node for a second one of the pair of CMOS amplifiers, wherein coupling a second transmission line to the signal input node for a second one of the pair of CMOS amplifiers includes coupling a second transmission line to a signal input node which has an input impedance (Zin) which matches a characteristic impedance (Zo) of the second transmission line.

56. The method of claim 55, wherein cross coupling a pair of CMOS amplifiers includes coupling the signal output node for each amplifier to a gate of the PMOS transistor and a gate of the second NMOS transistor on the other amplifier.

57. A differential transmission line receiver circuit, comprising:
a pair of cross-coupled line receivers each respectively receiving one of a first and a second current signal, the first and the second current signals comprising differential signals on a pair of transmission lines;
wherein a first one of the pair of cross coupled line receivers reduces an input impedance of a first one of the pair of cross-coupled line receivers using feedback driven by the first current signal on a first transmission line in order to match the input impedance of the first one of the pair of cross-coupled line receivers to a characteristic impedance of the first transmission line; and
wherein a second one of the pair of cross coupled line receivers reduces an input impedance of a second one of the pair of cross-coupled line receivers using feedback driven by the second current signal on a second transmission line in order to match the input impedance of the second one of the pair of cross-coupled line receivers to a characteristic impedance of the second transmission line.

58. The receiver circuit of claim 57, wherein the pair of cross coupled line receivers includes a cross coupled pair of cascode current-sense amplifiers.

59. The receiver circuit of claim 57, wherein the first transmission line and the second transmission line each have a length of at least of 1000 $\mu$m.

60. A differential line receiver circuit, comprising:
a first line receiver having a first input for receiving a first one of two signals of a differential signal on a first transmission line;
a second line receiver cross-coupled to the first line receiver, and having a second input for receiving a second one of two signals of the differential signal on a second transmission line;
wherein the first line receiver receives a feedback at the first input from the first one of two signals of a differential signal and provides therefrom a matching input impedance to a characteristic impedance of the first transmission line; and
wherein the second line receiver receives a feedback at the second input from the second one of the two signals of a differential signal and provides therefrom a matching input impedance to a characteristic impedance of the second transmission line.

61. An electronic system, comprising:
a processor; and
a memory device coupled to the processor, the memory device having a differential transmission line receiver circuit, having:
a pair of cross-coupled line receivers each respectively receiving one of a first and a second current signal, the first and the second current signals comprising differential signals on a pair transmission lines;

wherein a first one of the pair of cross coupled line receivers reduces an input impedance of the first one of the pair of cross coupled line receivers using feedback driven by first current signal from a first transmission line; and wherein a second one of the pair of cross coupled line receivers reduces an input impedance of the second one of the pair of cross coupled line receivers using feedback driven by the second current signal from a second transmission line.

62. The electronic system of claim 61, wherein the pair of cross coupled line receivers includes a cross coupled pair of cascode current-sense amplifiers.

63. The electronic system of claim 61, wherein the first transmission line and the second transmission line each have a length of at least of 1000 µm.

64. The electronic system of claim 61, wherein the input impedance to each one of the pair of cross-coupled line receivers matches a characteristic impedance for the first and the second transmission lines wherein the matching reduces the input impedance associated with the first and the second transmission lines.

65. A method of terminating a differential transmission line, comprising:

receiving a first current signal into a first signal input from a first transmission line and producing a first feedback signal in response thereto;

receiving a second current signal into a second signal input from a second transmission line and producing a second feedback signal in response thereto;

adjusting a first input impedance to match a characteristic impedance of the first transmission line in response to the first feedback signal; and adjusting a second input impedance to match a characteristic impedance of the second transmission line in response to the second feedback signal.

66. The method of claim 65, wherein receiving a first current signal from a first transmission line includes receiving a first current signal from a first transmission line which has a length of at least 1000 µm.

67. The method of claim 65, wherein receiving a second current signal from a second transmission line includes receiving a second current signal from a second transmission line which has a length of at least 1000 µm.

* * * * *